United States Patent
Faurie et al.

(10) Patent No.: US 9,312,129 B2
(45) Date of Patent: Apr. 12, 2016

(54) GROUP III-V SUBSTRATE MATERIAL WITH PARTICULAR CRYSTALLOGRAPHIC FEATURES AND METHODS OF MAKING

(71) Applicants: Jean-Pierre Faurie, Valbonne (FR); Bernard Beaumont, Le Tignet (FR)

(72) Inventors: Jean-Pierre Faurie, Valbonne (FR); Bernard Beaumont, Le Tignet (FR)

(73) Assignee: SAINT-GOBAIN CRISTAUX ET DETECTEURS, Courbevoie (FR)

( * ) Notice: Subject to any disclaimer, the term of this patent is extended or adjusted under 35 U.S.C. 154(b) by 150 days.

(21) Appl. No.: 14/018,127

(22) Filed: Sep. 4, 2013

(65) Prior Publication Data

US 2014/0065801 A1 Mar. 6, 2014

Related U.S. Application Data

(60) Provisional application No. 61/696,908, filed on Sep. 5, 2012.

(51) Int. Cl.
*H01L 21/76* (2006.01)
*H01L 21/02* (2006.01)

(52) U.S. Cl.
CPC ...... *H01L 21/02389* (2013.01); *H01L 21/0242* (2013.01); *H01L 21/0243* (2013.01); *H01L 21/0245* (2013.01); *H01L 21/0254* (2013.01); *H01L 21/0262* (2013.01); *H01L 21/02433* (2013.01); *H01L 21/02458* (2013.01); *H01L 21/02502* (2013.01); *H01L 21/02576* (2013.01); *H01L 21/02579* (2013.01); *H01L 21/02581* (2013.01)

(58) Field of Classification Search
CPC ............ H01L 21/0254; H01L 21/0242; H01L 21/02458; H01L 21/0262; H01L 21/02639; H01L 2924/0002; H01L 21/02647; H01L 21/0237; H01L 21/02389; H01L 2924/00; H01L 21/02505; H01L 21/02579; H01L 21/025

See application file for complete search history.

(56) References Cited

U.S. PATENT DOCUMENTS

| 7,566,580 | B2 | 7/2009 | Keller et al. |
| 7,755,172 | B2 | 7/2010 | Hashimoto et al. |
| 7,820,246 | B2 | 10/2010 | Sumiya et al. |
| 8,080,466 | B2 | 12/2011 | Su et al. |
| 2009/0081857 | A1* | 3/2009 | Hanser et al. ............... 438/507 |
| 2011/0033966 | A1* | 2/2011 | Su et al. ..................... 438/47 |
| 2011/0189837 | A1 | 8/2011 | Yu et al. |
| 2013/0001748 | A1* | 1/2013 | Faurie ............... H01L 21/0242 257/615 |

FOREIGN PATENT DOCUMENTS

WO 2008011897 A1 1/2008

OTHER PUBLICATIONS

Togashi, et al. "Influence of Substrate Polarity of (0001) and (0001) GaN surfaces on hydride vapor-phase epitaxy of InN" Journal of Crystal Growth, Elsevier, Amsterdam, NL, vol. 312, No. 5, Dec. 16, 2009, pp. 651-655.

(Continued)

*Primary Examiner* — Robert Bachner
(74) *Attorney, Agent, or Firm* — Abel Law Group, LLP

(57) ABSTRACT

A method of forming a semiconductor substrate including providing a base substrate including a semiconductor material, and forming a first semiconductor layer overlying the base substrate having a Group 13-15 material via hydride vapor phase epitaxy (HVPE), the first semiconductor layer having an upper surface having a N-face orientation.

20 Claims, 6 Drawing Sheets

(56) References Cited

OTHER PUBLICATIONS

Hageman, et al. "Thick GaN layers grown by hydride vapor-phase epitaxy: hetero- versus homo-epitaxy" Journal of Crystal Growth, Elsevier, Amsterdam, NL, vol. 255, No. 3-4, Aug. 2003, pp. 241-249.

Chen, et al. "Effective reduction of bowing in free-standing GaN by N-face regrowth with hydride vapor-phase epitaxy", Journal of Crystal Growth, Elsevier, Amsterdam, NL, vol. 311, No. 10, Jan. 20, 2009, pp. 3037-3039.

International Search Report for PCT/EP2013/068376 dated Dec. 3, 2013, 5 pgs.

* cited by examiner

GROUP III-V SUBSTRATE MATERIAL WITH PARTICULAR CRYSTALLOGRAPHIC FEATURES AND METHODS OF MAKING

CROSS-REFERENCE TO RELATED APPLICATION

This application claims priority under 35 U.S.C. §119(e) to U.S. Patent Application No. 61/696,908 entitled "A Group III-V Substrate Material With Particular Crystallographic Features And Methods Of Making", by Faurie et al., filed Sep. 5, 2012, which is assigned to the current assignee hereof and incorporated herein by reference in its entirety.

BACKGROUND

1. Field of the Disclosure

The following is directed to a method of forming a semiconductive substrate, and particularly, methods of shaping substrates and improve devices formed from such substrates.

2. Description of the Related Art

Semiconductive-based compounds, including Group III-V materials, such as gallium nitride (GaN), ternary compounds, such as, indium gallium nitride (InGaN) and gallium aluminum nitride (GaAlN), and even the quaternary compounds (AlGaInN) are direct band gap semiconductors. Such materials have been recognized as having great potential for short wavelength emission, and thus suitable for use in the manufacturing of light emitting diodes (LEDs), laser diodes (LDs), UV detectors, and high-temperature electronics devices.

However, the development of such semiconductive materials has been hampered by difficulties surrounding the processing of such materials, particularly the formation of high-quality single crystalline forms of the material, which are required for manufacturing of short wavelength emission in optoelectronics. GaN is not found as a naturally occurring compound, and thus cannot be melted and pulled from a boule like silicon, gallium arsenide, or sapphire, because at usual pressures its theoretical melting temperature exceeds its dissociation temperature. As an alternative, the industry has turned to formation of bulk GaN crystals using epitaxial growth processes. However, problems still remain with the epitaxial approach, including the formation of suitable low defect density bulk GaN material and the existence of other crystalline morphological differences, including crystalline bow.

The existence of extended defects (threading dislocations, stacking faults, and antiphase boundaries) leads to significantly deteriorated performances and results in a shortened operating lifetime of devices. More specifically, the dislocations behave as non-radiative centers, thus reducing the light-emitting efficiency of light-emitting diodes and laser diodes made from these materials. Furthermore, other factors, such as the crystalline orientation can negatively impact the performance of devices formed on the GaN material.

SUMMARY

In an embodiment, a method of forming a semiconductor substrate includes providing a base substrate having a semiconductor material, and forming a first semiconductor layer overlying the base substrate having a Group 13-15 material via hydride vapor phase epitaxy (HVPE). The first semiconductor layer has an upper surface having a N-face orientation.

In another embodiment, a method of forming a semiconductor substrate includes providing a base substrate having a semiconductor material including nitrogen, the base substrate also having a growth surface having a N-face orientation. The method of this embodiment also includes forming a first semiconductor layer overlying the base substrate having GaN via hydride vapor phase epitaxy (HVPE). The first semiconductor layer has an upper surface having a N-face orientation.

In yet another embodiment, a method of forming a series of semiconductor substrates using a single forming process includes providing a base substrate having a semiconductor material including nitrogen. The base substrate has a growth surface having a N-face orientation. The method of this embodiment also includes forming a boule overlying the base substrate, and cutting the boule to form a plurality of discrete semiconductor substrates.

In yet another embodiment, a semiconductor article includes a boule having GaN, an average thickness of at least 1 cm, and an upper surface having a N-face orientation.

BRIEF DESCRIPTION OF THE DRAWINGS

The present disclosure may be better understood, and its numerous features and advantages made apparent to those skilled in the art by referencing the accompanying drawings.

DETAILED DESCRIPTION

The following is generally directed to substrate materials, and particular, substrates comprising semiconductive materials, and which can include a plurality of semiconductive layers (i.e., semiconductive substrates) and methods of forming such articles. The semiconductive substrate may include Group 13-15 materials including for example gallium nitride (GaN). It will be appreciated that reference to Group 13-15 materials, include compounds including at least one element from Group 13 of the Periodic Table of Elements and at least one element from Group 15 of the Periodic Table of Elements based on the IUPAC Periodic Table of Elements, version dated Jan. 21, 2011. As will also be appreciated, embodiments herein are directed to the formation of a boule, which may facilitate formation of a plurality of substrates using a single forming process.

Figure 1:
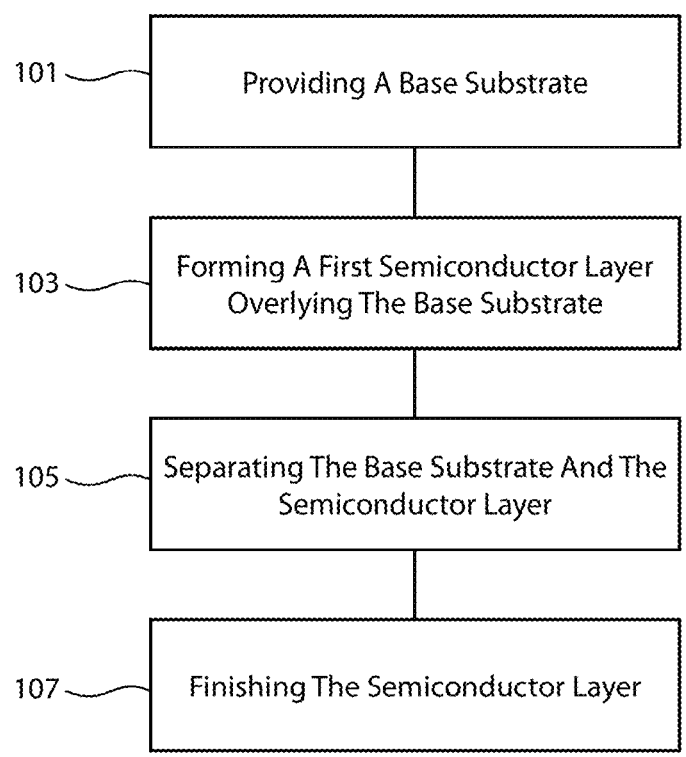
FIG. 1 includes a flow chart illustrating a method of forming a semiconductive substrate in accordance with the embodiment.
Figure 2A:
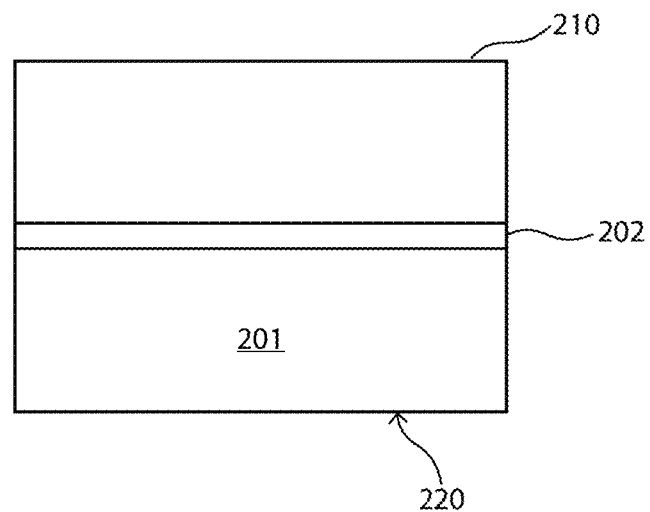
FIGS. 2A and 2B include illustrations of particular layers according to embodiments herein.
Figure 2B:
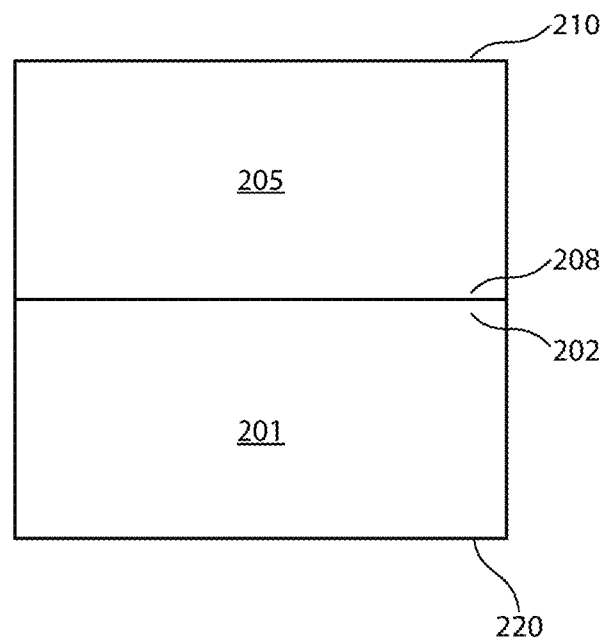

FIG. 1 includes a flow chart illustrating a method of forming a semiconductive substrate in accordance with the embodiment. FIGS. 2A-2B include illustrations of particular layers according to embodiments herein. With reference to FIG. 1, the process of forming a semiconductive substrate can be initiated at step 101 by providing a base substrate 201. The base substrate 201 can be a structure suitable for supporting a plurality of layers thereon and can have a growth surface 202 suitable for formation of one or more layers thereon.

According to one embodiment, the base substrate 201 can include a semiconductor material. Some suitable semiconductor materials can include Group 13-15 compound materials. According to one embodiment, the base substrate 201 can include gallium. In another instance, the base substrate 201 can include nitrogen. In one particular embodiment, the base substrate 201 can comprise gallium nitride (GaN), and more particularly, may consist essentially of gallium nitride.

Figures 3A, 3B:
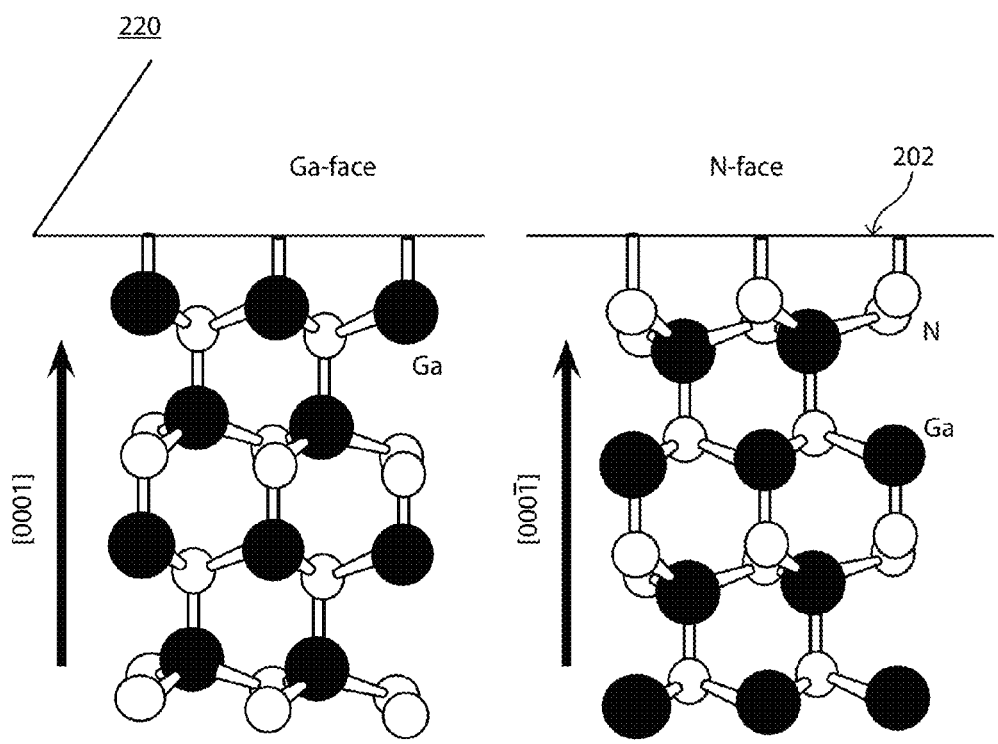
FIGS. 3A and 3B include illustrations of Ga-face orientation and N-face orientation of a GaN crystalline structure, respectively.

FIGS. 3A and 3B provide illustrations of Ga-polar orientation (also called Ga-face orientation) and N-polar orientation of a GaN crystalline structure. With reference to FIG. 2A, in certain embodiments, the bottom surface 220 of the base substrate 201 can have a Ga-face orientation, wherein the Ga atoms (Ga) of the crystalline structure define and intersect the bottom surface 220. In other embodiments, the base substrate 201 can have a grown surface having a-c oriented or N-polar orientation (also called N-face orientation). FIG. 3B illustrates a N-face orientation, wherein the nitrogen atoms (N) of the crystalline structure define and intersect the growth surface 202 of the base substrate 201. Notably, in case of polar planes, such as the (0002) c-plane in the wurtzite structure, the base substrate 201 will have a bottom surface 220 that is opposite to the growth surface 202, in terms of polarity.

In further embodiments, the base substrate 201 can have a growth surface having a N-face orientation. In certain embodiments, the base substrate 201 is an epi-ready N-polar c-plane oriented bulk GaN substrate. It will be appreciated that the strain in an epitaxial layer when starting with an epi-ready N-polar c-plane oriented bulk GaN substrate is substantially less than the strain in an epitaxial layer when starting with a sapphire substrate. It will also be appreciated that the defect density of a N-face orientation growth surface is less than the defect density of its Ga-face oriented counterpart backside surface.

According to one embodiment, the base substrate 201 can be essentially free of a dopant material. Still, in other instances, the base substrate 201 can have a n-type dopant, including for example, elements such as O, Si, Ge, and a combination thereof. The base substrate 201 can have a dopant concentration of the n-type dopant of at least about $1\times10^{17}$ cm$^{-3}$ and not greater than about $1\times10^{22}$ cm$^{-3}$. In an alternative design, the base substrate 201 can have a p-type dopant. One suitable p-type dopant can include Mg, Fe, and Zn. For at least one embodiment, the dopant concentration of the p-type dopant within the base substrate 201 can be at least about $1\times10^{17}$ cm$^{-3}$ and not greater than about $1\times10^{22}$ cm$^{-3}$.

Figure 4:
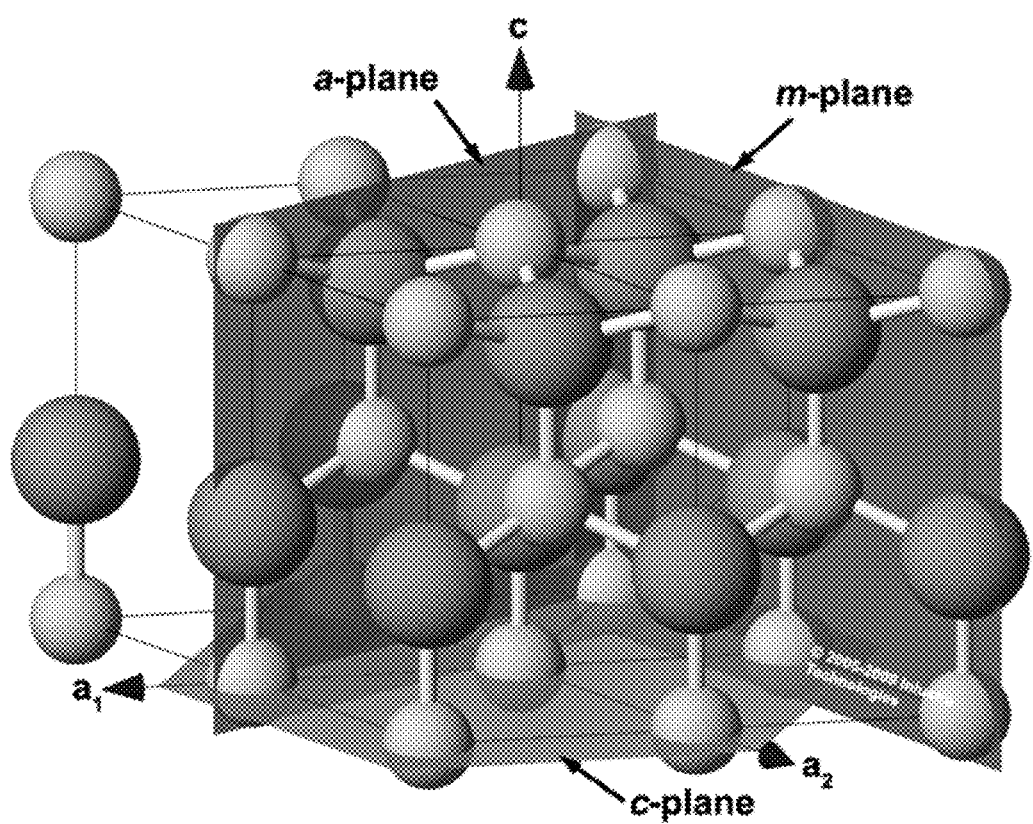
FIG. 4 provides an illustration of a GaN crystalline structure including identification of a c-plane, a-plane, and m-plane.

According to another embodiment, the base substrate 201 can have a c-plane crystallographic orientation, such as the crystallographic orientation shown in FIG. 3B. In one particular instance, the base substrate 201 can have a growth surface 202 defining an upper exterior surface of base substrate 201. Moreover, in certain instances, the base substrate 201 can have an offcut angle defined as an angle between the growth surface 202 and a crystallographic reference plane within the crystalline material. For example, the base substrate 201 can have a c-plane orientation with an offcut angle toward the a-plane or m-plane of at least about 0.05 degrees, such as at least about 0.08 degrees, at least about 0.1 degrees, or even at least about 0.3 degrees. In one non-limiting embodiment, the offcut angle can be not greater than about 5 degrees, such as not greater than about 3 degrees, not greater than about 1 degree, or even not greater than about 0.8 degrees. It will be appreciated that the offcut angle can be within a range between any of the minimum and maximum values noted above. In another non-limiting embodiment, the offcut angle can be not greater than 10 degrees, such as not greater than about 8 degrees, not greater than about 5 degrees, and not greater than about 3 degrees. Moreover, FIG. 4 provides an illustration of a GaN crystalline structure including identification of a c-plane, a-plane, and m-plane, wherein the a-plane and m-plane can be non-polar planes.

Referring back to FIG. 1, after providing a substrate at step 101, the process can continue at step 103 by forming a semiconductor layer 205 overlying the base substrate 201. In some embodiments, the semiconductor layer 205 can be formed directly on the growth surface 202 of the base substrate 201. FIG. 2B includes an illustration of a semiconductive substrate formed according to these embodiments. However, it will be appreciated that some embodiments may utilize one or more intervening layers between the base substrate 201 and the semiconductor layer 205, such as a buffer layer.

In one particular instance, the semiconductor layer 205 can be made of a Group 13-15 material. Some suitable Group 13-15 materials can include nitride materials. Furthermore, the semiconductor layer 205 may include gallium. In particular instances, the semiconductor layer 205 may include gallium nitride (GaN), and more particularly, may consist essentially of gallium nitride.

Particular methods of forming the semiconductor layer 205 can be undertaken. For example, in utilizing a HVPE process, the formation of the base layer material can be conducted in various growth modes. For example, in one embodiment the base layer is initially formed as an epitaxial layer grown in a 3-dimensional (3D) growth mode. A 3D growth mode can include the simultaneous growth of the semiconductor layer 205 material along multiple crystallographic directions. In the 3D growth mode, the growth along the c-axis is faster than the growth in lateral directions. As a result, in the 3D growth mode the development of facet planes is favored over the c-plane, and this will be reflected in the layer morphology, which displays small c-plane (mesas) having multiple facets and valleys between the mesas.

Alternatively, or additionally, forming of the semiconductor layer 205 can include epitaxial growth in a 2-dimensional (2D) growth mode. A 2D growth mode is characterized by the so called layer by layer growth mode. Actually in a 2D growth mode, the growth along the c-axis is slower than growth in lateral directions. As a result, in a 2D growth mode, the development of c-plane is favored over the development of facet planes. For example, in one embodiment, formation of a semiconductor layer 205 comprising GaN in a 2D growth mode includes preferential growth of the GaN in the c-plane (0001), such that 205 layer will display a c-plan oriented flat morphology.

It will be appreciated that in embodiments, forming of the semiconductor layer 205 can incorporate a combination of 3D and 2D growth modes. For example, the semiconductor layer 205 may be initially formed in a 3D growth mode, wherein island features are spontaneously formed on the buffer layer 203 (or base substrate 201) as a non-continuous layer of material during the very first steps of the growth.

In embodiments incorporating a 3D growth mode, the growth surface can develop a rough and non-planar 3D morphology with pits, facets and/or terraces. The growth of the semiconductor layer 205 may progress along the c-axis but through simultaneous growth along multiple crystallographic directions. Due to a faster growth rate along the c-axis than in lateral directions, the semi-polar plane facets develop faster than c-plane terraces in the semiconductor layer 205.

Alternatively, or additionally, in certain embodiments the semiconductor layer 205 can be formed using a 2-dimensional (2D) epitaxial growth mode. In a 2D growth mode, the growing surface can be substantially smooth and remain essentially planar during the growth process.

Formation of the semiconductor layer can be achieved by controlling certain growth process parameters include growth temperature, growth rate, pressure of vapor phase reactant and non-reactant materials, ratio of reactant and non-reactant materials in the reaction atmosphere, growth chamber pressure, and a combination thereof. Reference herein to a reactant material includes reactant materials such as nitrogen-containing materials, such as ammonia. Other reactant materials can include halide phase components, including for example, metal halide components such as gallium chloride. Non-reactant materials can include certain types of gases including for example noble gases, inert gases, and the like. In particular instances the non-reactant material can include gases such as nitrogen and/or hydrogen.

In embodiments, during formation of the semiconductor layer 205, including production of the semiconductor layer 205 in a 3D growth mode, the growth temperature can be at least about 750° C. In other embodiments, the growth temperature can be greater, such as at least about 800° C., at least about 850° C., at least about 875° C., at least about 900° C., or even at least about 925° C. According to one method of forming, the growth temperature during formation of the semiconductor layer 205 can be not greater than about 1200° C., such as not greater than about 1150° C., not greater than about 1125° C., not greater than about 1050° C., or even not greater than about 1000° C. In yet other embodiments, the growth temperature during formation of the semiconductor layer 205 can be at least about 950° C., such as at least about 980° C., at least about 1000° C., at least about 1020° C., at least about 1050° C., or even at least about 1100° C. In yet other embodiments, the growth temperature can be no greater than about 1500° C., no greater than about 1400° C., no greater than about 1350° C., no greater than about 1300° C., or no greater than about 1250° C. In one particular embodiment, the growth temperature during formation of the semiconductor layer 205 can be in a range of from about 1020° C. to about 1080° C. It will be appreciated that the growth temperature can be within a range between any of the minimum and maximum values noted above.

For certain processes, the growth temperature may be changed to facilitate a change between 3D and 2D growth modes. This layer by layer growth mode can be characterized by a higher lateral growth rate of the semiconductor layer 205 than along the c-axis, thus favoring the c-plane (0001) development over the semi polar planes (facets).

For example, in changing from 3D to 2D growth modes, the temperature may be changed by at least about 5° C., such as at least about 10° C., at least about 15° C., at least about 20° C., at least about 30° C., at least about 35° C., or even at least about 40° C. In still other embodiments, in changing from a 3D to 2D growth mode, the growth temperature can be changed by not greater than about 100° C., such as not greater than about 90° C., not greater than about 80° C., not greater than about 70° C., or even not greater than about 60° C. Change of the growth temperature can include an increase in the growth temperature in changing from 3D to 2D growth modes. It will be appreciated that the change in growth temperature can be within a range between any of the minimum and maximum values noted above.

In accordance with certain embodiments, the process of forming the semiconductor layer 205 can be conducted at a growth rate of at least 50 microns per hour. In other embodiments, the rate of forming the semiconductor layer 205 can be greater, such as at least about 75 micron per hours, at least about 100 microns per hour, at least about 150 microns per hour, at least about 200 microns per hour, or even at least about 250 microns per hour. In still other embodiments, the process of forming the semiconductor layer 205 can be conducted at a rate of not greater than about 1 mm per hour, such as not greater than 750 microns per hour not great 500 microns per hour, or even not greater than about 300 microns per hour. It will be appreciated the process of forming the base layer can be constructed at a rate within a range within any of the minimum maximum values noted above.

For certain processes, the growth rate may be changed to facilitate a change between 3D and 2D growth modes. For example, in changing from 3D to 2D growth, the growth rate may be changed by at least about 5 microns per hour, such as at least about 10 microns per hour, at least about 15 microns per hour, at least about 20 microns per hour, at least about 40 microns per hour, at least about 50 microns per hour, or even at least about 75 microns per hour. In still other embodiments, in changing from a 3D to 2D growth mode, the growth rate can be changed by not greater than about 200 microns per hour, such as not greater than about 175 microns per hour, not greater than about 150 microns per hour, not greater than about 125 microns per hour, or even not greater than about 100 microns per hour. It will be appreciated that the change in growth rate can be a decrease in the growth rate when changing from a 3D to a 2D growth mode. It will be appreciated that the change in growth rate can be within a range between any of the minimum and maximum values noted above.

According to other embodiments, the process of changing from 3D to 2D growth modes may be induced by a change in growth rate by at least a factor of 2. For example, the growth rate can be decreased by a factor of at least 2 in changing from a 3D growth mode to a 2D growth mode. In other embodiments, the growth rate can be decreased by a factor of at least about 3, at least about 4, or even at least about 5. In particular instances, the decrease in the growth rate is not greater than about a factor of 8, not greater than a factor of about 7, or not greater than a factor of about 6.

It will be appreciated that in changing the growth mode, one or more of the above-identified factors can be changed. For example, the growth temperature can be changed, while the growth rate is held steady. Alternatively, the growth rate can be changed while the growth temperature is maintained. And still, in another embodiment, both the growth rate and growth temperature may be changed to effectuate the change in growth modes. By changing the growth mode from 3D to 2D, the vertical/lateral growth rate ratio will decrease from greater than 1 to less than 1. During this transition, while the crystal is growing, the surface morphology (including small terraces, well developed semi-polar facets and valleys) will evolve towards a flat c-plane. The opposite or reverse will occur when changing the growth mode from 2D to 3D. Accordingly, this demonstrates that the semi-polar facets and valleys do not represent "permanent defects." The phrase "permanent defect" can be described as a defect that cannot be removed through conventional growth techniques, such as, for example, alternating between 3D and 2D growth modes.

When growing on a Ga-face oriented growth surface, a resulting wafer may include various defects within the semiconductor layer 205. For example, the defect can be in the form of a pit extending into the volume of the semiconductor layer 205 as defined by the thickness ($t_s$). Such a defect may also take the form of a permanent pit (a permanent defect). In some instances, the permanent pit may be a macroscopic pit. The shape of the macroscopic pit can vary, and includes such shapes as a hexagonal inverted pyramid or a dodecagonal inverted pyramid.

Permanent pits can also include side surfaces defined by a facet. More specifically, in order to connect the bottom surface of the pit and the upper surface of semiconductor layer 205 facets are created. Such facets may be semi-polar facets that can be defined by particular crystalline planes of the semiconductor material, including for example, a {11-22} plane, a {1-101} plane, and a combination thereof.

In addition, the defects that may result when growing on a Ga-face oriented growth surface can also include a permanent defect region. In certain instances, the permanent defect region can include a bottom surface of the defect, and in some cases, may be defined by said bottom surface of the defect. For example, in cases where the bottom surface of the permanent defect region serves to define the particular type of defect, the defect may result in being an inclusion, a polycrystalline grain, a single crystalline grain, with or without a common c-axis with the surrounding semiconductor material of layer 205, an inversion domain, a boundary (e.g., an anti-phase boundary, a twin boundary, a grain boundary), and/or a combination thereof.

With respect to boundaries, a boundary can define a region of the semiconductor layer that represents a shift in the regular arrangement of crystalline phases. For example, a polarity inversion of the crystalline structure, including for example, a change in the order of polar planes, such as a Ga-polar face and a N-polar face of the crystal structure, can result in an anti-phase boundary. A shift between crystalline planes having a twin relation creates a boundary called a twin boundary. Moreover, a shift in crystal orientation between a single crystal in the defect region and the surrounding crystalline structure of the semiconductor material of the semiconductor layer 205 can define a permanent defect in the form of a grain boundary. The defect 247 can define permanent and irreversible region within the crystalline structure of the semiconductor layer 205 that may be propagated through the structure through further growth and may not be readily removed through continuous growth techniques.

In particular, growth that occurs on permanent defects can correspond to a permanent and irreversible region within the crystalline structure of the semiconductor layer 205. Growth on a permanent defect (defects of which can occur when growing on a Ga-face oriented growth surface) can be in a form of a polycrystalline grain or an inversion domain with N-polarity.

Moreover, it will be appreciated that the growth rate is slower than along the Ga-polarity as opposed to N-polarity. Due to this growth rate difference, the depth and the width of the pit increase with semiconductor layer 205 thickness for growth along the Ga-polarity. In some instances, approximately 60% of the semiconductor upper layer 205 contains pits when growing on a Ga-face oriented growth surface. The material loss associated with removing such defective upper layer has a significant impact on epi-ready GaN substrate cost.

Growth along the N-polarity (as opposed to growth along the Ga-polarity) can also create defects within the semiconductor layer 205. Permanent defects relating to growth along the N-polarity may take the form of a hillock, a protrusion, or a pyramid with an inversion domain on their tips exhibiting a Ga-polarity.

It will be appreciated that the growth rate of a hillock, protrusion or a pyramid is faster for a semiconductor layer 205 which is growing along the N-polarity. Accordingly, compared to what is observed for growth along the Ga-polarity, a substantially lesser amount of the semiconductor layer 205 is lost in the process of removing permanent defects, providing a significant cost benefit.

In embodiments, the semiconductor layer 205 can be formed to have a particular thickness to facilitate further processes and the formation of a high quality material according to embodiments herein. For example, the semiconductor layer 205 may have an average thickness of at least about 0.1 mm, such as at least about 0.5 mm, at least about 1 mm, at least about 2 mm, or even at least about 3 mm. Still, in other embodiments, the semiconductor layer 205 can be formed to have an average thickness not greater than about 50 mm, such as not greater than about 40 mm, or even not greater than about 20 mm. It will be appreciated that the semiconductor layer 205 can be formed to have an average thickness within a range between any of the minimum and maximum values noted above.

In embodiments, the semiconductor layer 205 can be formed to have a particular dislocation density. The dislocation density of the base 205 can be measured at the upper surface of the base layer upon forming. A suitable method of measuring the dislocation density includes use of cathode luminescence microscopy operated at room temperature and polychromatic light detection without monochromator under 10 keVe-beam, spot size 70, wherein the machine is an SEM JSM-5510, commercially available from JEOL Corporation. For a dislocation density measurement of approximately $10^8$ $cm^{-2}$, the magnification is 4000× and the area is typically 700 $\mu m^2$. For a dislocation density measurement of approximately $10^6$ $cm^{-2}$, the magnification is typically 500-1000× and the area is typically 0.1 $mm^2$.

For example, the semiconductor layer 205 can have a dislocation of density not greater than about $1\times10^8$ dislocation/$cm^2$, as measured at an upper surface of the semiconductor layer 205. In other embodiments, the dislocation density of the semiconductor layer 205 can be less, such that it is not greater than about $1\times10^7$ dislocation/$cm^2$, not greater than about $5\times10^6$ dislocation/$cm^2$, or even not greater than about $1\times10^6$ dislocation/$cm^2$. Still, the semiconductor layer 205 may have a dislocation density that is at least about $1\times10^4$ dislocation/$cm^2$, or even at least $1\times10^5$ dislocation/$cm^2$. It will be appreciated that the semiconductor layer 205 can have a dislocation density within a range within any of the minimum and maximum values noted above.

In certain cases, the semiconductive layer 205 can have an upper surface 210 having a N-face orientation. Referring again to FIG. 3B, an illustration of Ga-face orientation of a GaN crystal is provided. According to one particular embodiment, the nitrogen atoms (N) of the crystalline structure define and intersect the upper surface 210 of the semiconductor layer 205.

According to one embodiment, the first semiconductor layer 205 can include a dopant, such a n-type dopant or a p-type dopant. Suitable n-type dopants can include as O, Si, Ge, and a combination thereof. Suitable examples of a p-type dopant can include Mg, Fe, and Zn. Moreover, the semiconductor layer 205 may contain a concentration of a n-type or a p-type dopant of at least about $1\times10^{17}$ $cm^{-3}$, such as at least about $1\times10^{18}$ $cm^{-3}$, or even at least about $1\times10^{19}$ $cm^{-3}$. Still, in one non-limiting embodiment, the concentration of a n-type or p-type dopant in the semiconductor layer 205 can be not greater than about $1\times10^{22}$ $cm^{-3}$.

It will be appreciated that in certain embodiments according to the present disclosure, a template substrate structure can be produced comprising a semiconductor layer 205 formed directly on a base substrate 201 having a N-face orientation, without the use of a buffer layer. In these embodiments, growth occurs along the—c-plane utilizing a N-polar oriented bulk GaN base substrate. In certain embodiments, growth in the N-polar orientation can be achieved on the N-polar epi-ready backside surface of a bulk GaN substrate.

In one particular embodiment, the upper surface of the first semiconductor layer comprises a plurality of pyramids and/or hillocks. The pyramids and/or hillocks may be of a particular size, and can also be referred to as protrusions, extending from the N-face of the upper surface 210 of the semiconductor layer 205. According to one particular instance, the protrusions can have an average height ratio ($h/t_t$) of not greater than about 0.6, wherein h represents an average height of the plurality of protrusions and $t_t$ represents the semiconductor layer 205 thickness. In still other instances the average height ratio of the protrusions can be not greater than about 0.5, not greater than about 0.4, not greater than about 0.3 not greater than about 0.2 or not greater than about 0.1. Notably, as opposed to particular GaN substrates growth with the Ga-face as the upper face, the present embodiments utilize a N-face orientation facilitating formation of protrusions on the upper surface 210, resulting in more efficient post-processing procedures FIG. 5 includes a cross-sectional illustration of a semiconductor layer 205 according to an embodiment. Notably, the semiconductor layer 205 can have an upper surface 210 having a N-face orientation and including a plurality of protrusions 501, wherein each of the protrusions have a height (h), and wherein averaging the height of a representative sampling of protrusions 501 on the upper surface facilitates calculation of an average height.

In certain embodiments, the protrusions 501 can have an average height ratio ($h/t_t$), wherein h represents an average height of the plurality of protrusions and $t_t$ represents an average thickness of the semiconductor layer 205. For example, the average height ratio of the protrusions can be not greater than about 0.6, no greater than about 0.5, not greater than about 0.4, not greater than about 0.3, or not greater than about 0.2. In other embodiments, the average height ratio can be at least about 0.01, at least about 0.05, or at least about 0.1. According to a particular embodiment, the average height ratio ($h/t_t$) can be not greater than about 0.25. It will be appreciated that the average height ratio can be within a range between any of the minimum and maximum values noted above.

According to one embodiment, each of the protrusions 501 of the plurality of protrusions can define a permanent defect region in the semiconductor layer 205. A permanent defect region can be a shift in the regular arrangement of crystalline planes. In one particular instance, the permanent defect region can be an inclusion, a polycrystalline grain, a single crystalline grain, an inversion domain, a boundary (e.g., an anti-phase boundary, a twin boundary, a grain boundary), and a combination thereof. A permanent defect region of the semiconductor layer 205 can represent a shift in the regular arrangement of crystalline phases. For example, a polarity inversion of the crystalline structure, including for example, a change in the order of polar planes, such as a Ga-polar face and a N-polar face of the crystal structure, results in an anti-phase boundary. A shift between crystalline planes having a twin relation creates a boundary called a twin boundary. Moreover, a shift in crystal orientation between a single crystal in the defect region and the surrounding crystalline structure of the semiconductor material of the semiconductor layer 205 can define a permanent defect in the form of a grain boundary. The permanent defect region can define a permanent and irreversible region within the crystalline structure of the semiconductor layer 205 that may be propagated through the structure through further growth and may not be readily removed through continuous growth techniques.

Figure 5:
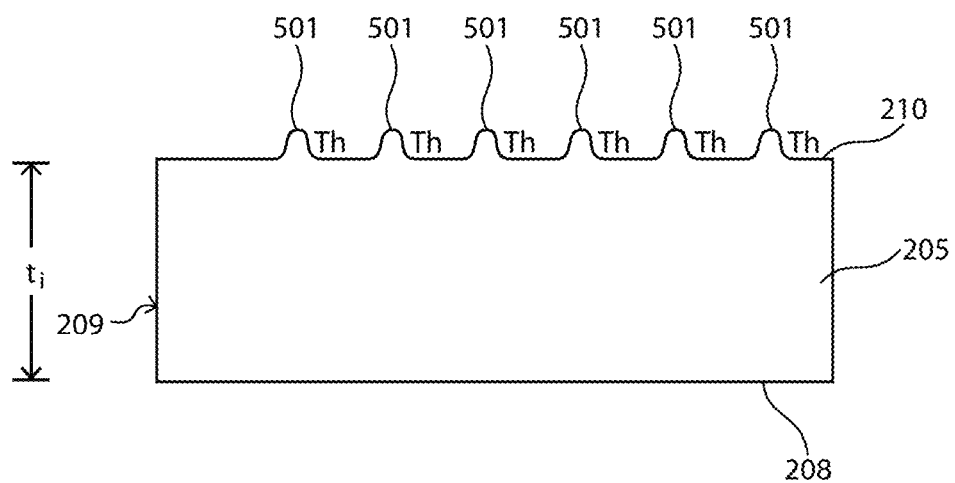
FIG. 5 includes a cross-sectional illustration of a semiconductor layer according to an embodiment.

As illustrated in FIG. 5, the semiconductor layer 205 also comprises a back surface 208 opposite the upper surface 210, and separated by a side surface 209 of the semiconductor layer 205. The back surface 208 can have a Ga-face orientation, and also has a substantially flat surface with no pits, as illustrated in FIG. 5. The absence of pits can be explained with reference to FIG. 2B. For example, in embodiments HVPE GaN growth begins on a base substrate 201, such as a N-polar GaN substrate. At the 201/205 interface, the N-polar upper surface of the GaN base substrate is in contact with the backside of the semiconductor layer 205 (in this example, a GaN epilayer), which is Ga-polar. As a result, the 201/205 interface is substantially flat, and essentially free of any geometric characteristics, such as pits, which would likely otherwise appear if the semiconductor layer 205 were formed with a Ga-face orientation.

Referring back to FIG. 1, the process of forming a semiconductive substrate may continue at optional step 107, which includes finishing the semiconductor layer 205. According to an embodiment, the process of finishing can include removing at least a portion of the upper surface 210 of the first semiconductor layer 205, and notably removing the plurality of protrusions 501 from the upper surface 210.

According to one particular embodiment, the process of removing can be conducted via a mechanical process, a chemical process, and a combination thereof. For example, the process of mechanically removing a portion of the upper surface 210 can include a series of abrasive processes. For example, the removing process can be initiated by a first grinding process to remove a significant portion of material from the upper surface 210 of the semiconductor layer 205. The first grinding process may utilize a fixed abrasive, and particularly, a self-dressing vitrified bonded abrasive article. The first grinding process may be followed by a second removal process. The second removal process can include a fine grinding process, lapping process, polishing process, and a combination thereof. In a certain fine grinding process, a second fixed abrasive article (e.g., a self-dressing vitrified bonded abrasive) may be used that has a finer abrasive grit size as compared to a fixed abrasive used in the first grinding process. Additionally or alternatively, the second removal process can include a lapping process, which may utilize a pad and a free abrasive slurry. The free abrasive slurry may include chemical components that can facilitate chemical removal of the material of the upper surface 210. Additionally or alternatively, the second removal process may include a polishing process that can include use of a free abrasive slurry having a particularly fine abrasive particulate size. Finishing of the semiconductor layer 205 can be conducted to produce an epi-ready upper surface 210 having N-face orientation and prepared for the formation of electronic devices thereon.

It will be appreciated that a finishing process may also be optionally carried out on the upper surface 210 of the semiconductor layer 205 and/or at least a portion of the backside of the base substrate 201. The finishing process may include one or a combination of processes described above with regard to mechanical processes, chemical processes, and a combination thereof. In one embodiment, the process of finishing can include removal of protrusions extending from the upper surface 210 of the semiconductor layer 205, and at least a portion of the backside of the base substrate 201.

It will also be appreciated that although either a pit or a protrusion, or a combination thereof, may be formed in or on the surface of a semiconductor layer or layers during growth, obtaining a semiconductor layer with protrusions rather than pits is generally desirable to facilitate the growth a semiconductor layer absent voids and/or layer defects. Said voids and/or layer defects adversely affect the crystallinity of the semiconductor layer. The ability of the protrusion or the pit to scatter or diffract light is hindered, resulting in lower output power of the light emitting device. In order to prevent defects from growing in the semiconductor layer and minimize adverse effects on, for example, the circuit performance of a finished product utilizing the semiconductor layer, various cleaning finishing processes are employed, as described above. It will be appreciated that it is easier and more cost-effective to remove protrusions than pits, as processes employed for the removal of pits accordingly removes a significant amount of semiconductor layer material, in order to obtain a flat or smooth surface.

Figure 6:
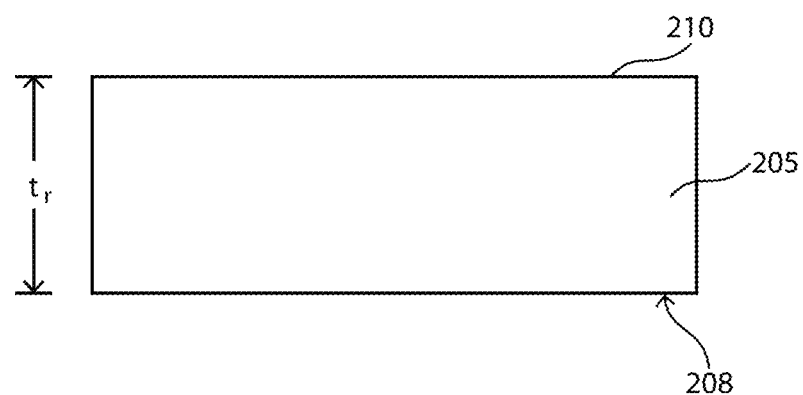
FIG. 6 includes a cross-sectional illustration of a finished semiconductor wafer according to an embodiment.

FIG. 6 includes a cross-sectional illustration of a finished semiconductor wafer according to an embodiment. As illustrated, the front surface 210 is essentially free of protrusions 501. The back surface 208 of the semiconductor layer 205, similar to FIG. 5, also has an essentially atomically flat surface with no pits, as illustrated in FIG. 6.

Moreover, as illustrated in a comparison of FIG. 5 and FIG. 6, the process of removing can include a reduction in the average thickness of the semiconductor layer 205. In accordance with an embodiment, the process of removing can include reducing the average thickness of the semiconductor layer 205 by not greater than about 50% of the original thickness ($t_i$) of the semiconductor layer 205 prior to the process of removing. The change (e.g., reduction) in average thickness ($\Delta t$) can be measured by the equation $((t_i-t_r)/t_i)$, wherein $t_i$ is the initial thickness and $t_r$ is the thickness of the semiconductor layer 205 after conducting the removing process. Notably, given the method of forming the semiconductor layer 205 according to embodiments herein, the amount of material that is removed from the semiconductor layer 205 to produce a finished semiconductor wafer is less, thus improving the efficiency of the process. In other embodiments, the average thickness of the semiconductor layer 205 can be reduced by not greater than about 45%, not greater than about 40%, not greater than about 35%, or even not greater than about 30%. Still, in one non-limiting embodiment, the process of removing can reduce the thickness of the semiconductor layer 205 by at least about 5% of the original thickness of the first semiconductor layer prior to removing, such as at least about 10%, at least about 16%, or even at least about 18%. It will be appreciated that the change in the average thickness of the semiconductor layer 205 can be within a range between any of the minimum and maximum percentages noted above.

According to one embodiment, after conducting finishing and preparing the upper surface 210 of the semiconductor layer 205, the resulting finished semiconductor wafer may be sold and used to facilitate fabrication of electronic devices on the upper surface 210.

Alternatively, further processing may be conducted. For example, in one alternative embodiment, prior to separating and finishing, a semiconductor boule may be formed, wherein the boule comprises a semiconductor layer 205 having an average thickness sufficient to form at least two discrete freestanding semiconductor wafers. In some embodiments, the average thickness of the boule can be at least about 0.5 mm, such as at least about 1.1 cm, at least about 1.2 cm, at least about 1.25 cm, at least about 1.5 cm, and at least about 2 cm. In one non-limiting embodiment the average thickness of the boule can be less than about 10 cm, such as less than about 8 cm, less than about 6 cm, or even less than about 5 cm. It will be appreciated that the average thickness of the boule can be within a range between any of the above minimum and maximum values.

In certain embodiments, a boule can be formed by continuously growing the semiconductor layer, until a suitable thickness is achieved. According to another alternative embodiment, a boule can be formed by conducting a continuous growth process, wherein the boule is formed to have a plurality of release layers spaced apart from each other by a plurality of semiconductor layers. The release layers facilitate separation of the distinct semiconductor layers and the formation of discrete and separate freestanding semiconductor wafers from the distinct semiconductor layers of the boule.

Figure 7:
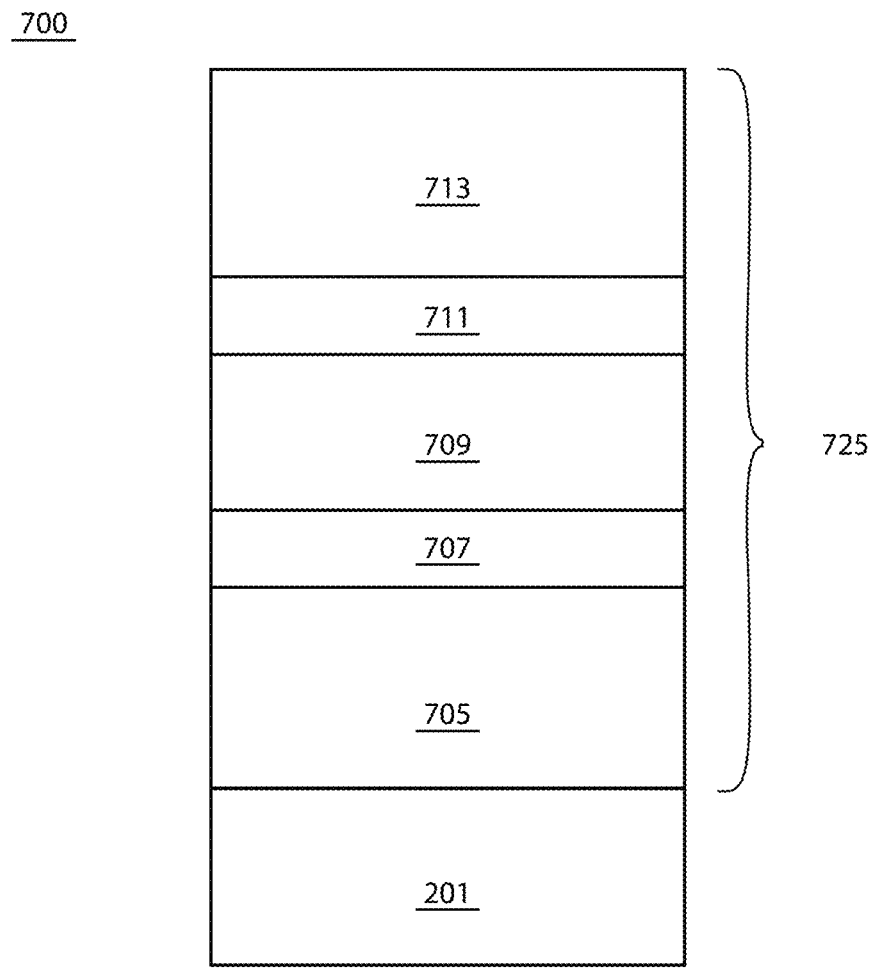
FIG. 7 includes a cross-sectional illustration of boule according to an embodiment.

For example, FIG. 7 includes an illustration of a boule according to an embodiment. As illustrated, the boule 700 can include a base substrate 201, and a plurality of semiconductor layers 725 overlying the buffer layer 203 and base substrate 201. In particular, the plurality of semiconductor layers 725 can include a first semiconductor layer 705, a first release layer 707 overlying the first semiconductor layer 705, a second semiconductor layer 709 overlying the first release layer 707, a second release layer 711 overlying the second semiconductor layer 709, and a third semiconductor layer 713 overlying the second release layer 711. The semiconductive layers 725 can be formed according to a continuous growth process, wherein each of the layers are continuously grown over each other without interrupting the deposition or epitaxy process. Notably, each of the layers of the plurality of semiconductive layers 725 can be formed using HVPE and formation of the release layers 707 and 711 can be facilitated by a change in certain growth process parameters that facilitate the change in epitaxial conditions used during formation of semiconductor layers 705, 709 and 713. One or a combination of the growth process parameters such as growth temperature, growth rate, pressure of vapor phase reactant and non-reactant materials, ratio of reactant and non-reactant materials in the reaction atmosphere, growth chamber pressure, can be altered to facilitate formation of the release layers 707 and 711. Moreover, each of the layers of the semiconductive layers 725 can have a N-face orientation.

In one particular embodiment, the upper surface of the boule comprises a plurality of protrusions, wherein the protrusions have an average height ratio ($h/t_i$) of not greater than about 0.6, wherein h represents an average height of the plurality of protrusions and $t_i$ represents semiconductor layer 713 thickness.

In accordance with a particular embodiment, the formation of the first release layer 707 can be facilitated by a change in concentration of a vapor phase reactant material within the reaction chamber from forming the base layer 205 to forming the first release layer 707. For example, a particular vapor phase reactant material, such as a dopant material, may be introduced into the reaction chamber to facilitate formation of the first release layer 707. In accordance with embodiment, suitable dopants can include elements such as C, Mg, Zn, Si, Sn, O, Fe, Ge, and a combination thereof. In one particular embodiment, during the formation of the first release layer 707, a 2D growth mode can be utilized. In such instances, a dopant material such as Fe, Ge or a combination thereof can be introduced into the growth chamber to facilitate formation of the release layer. According to another embodiment, the release layer can be formed using a 3D growth mode. Suitable dopant materials for use in 3D growth modes can include O, Ge, and a combination thereof. The dopant material can be introduced into the reaction chamber at a particular manner to facilitate suitable formation of the first release layer 707 having desired characteristics, including for example, absorption coefficient. The dopant material can be injected at a dopant/Ga vapor phase ratio of at least about 0.001 and not greater than about 0.01.

The dopant material can be introduced into the reaction chamber for a particular duration. For example, the dopant can be present within the reaction chamber for a duration of at least about 1 second and not greater than about 5 minutes.

In accordance with embodiment, the first release layer 707 can be formed to have a particular concentration of a dopant material. For example, the concentration of a dopant within a first release layer 707 can be at least about $2\times10^{18}$ cm$^{-3}$, such as at least about $4\times10^{18}$ cm$^{-3}$, at least about $8\times10^{18}$ cm$^3$, or even at least about $1\times10^{19}$ cm$^3$. Still, the first release layer 707 may be formed such as the dopant concentration is not greater than about $1\times10^{21}$ cm$^{-3}$, such as not greater than $1\times10^{20}$ cm$^3$, or even not greater than $5\times10^{19}$ cm$^{-3}$. It will be appreciated that the dopant concentration within the first release layer 707 can be within the range between any of the minimum and maximum values noted above.

The first release layer 707 can include a Group 13-15 material including the dopant material. For example, the first release layer 707 can include a nitride material. In one instance, the first release layer 707 can include gallium, and more particularly may include gallium nitride. In a particular embodiment, first release layer 707 is formed such as it consists essentially of gallium nitride. It will be appreciated that consisting essentially of gallium nitride does allow for the particular concentrations of dopant material described herein.

The first release layer 707 can be formed such it has a particular absorption coefficient with respect to radiation of a certain wavelength, including radiation having a wavelength within the visible spectrum. The first release layer 707 can be formed such that it absorbs significantly greater amount of radiation than the first semiconductor layer 205, and as such, the absorption coefficient of the first release layer 707 can be significantly greater than the absorption coefficient of the first semiconductor layer 205.

According to one embodiment, the first release layer 707 can be formed such as it has an absorption coefficient of at least 800 cm$^{-1}$ for radiation within the visible spectrum. In other embodiments, the absorption coefficient of the first release layer 707 can be greater, such as at least about 1000 cm$^{-1}$, about 2000 cm$^{-1}$, at least about 3000 cm$^{-1}$, or even at least about 5000 cm$^{-1}$. Still, it will be appreciated that the absorption coefficient of the first release layer 707 can be not greater than about 10,000 cm$^{-1}$, such as not greater than about 9,000 cm$^{-1}$, not greater than about 8,000 cm$^{-1}$, or even not greater than about 7,000 cm$^{-1}$, for radiation within the visible spectrum. It will be appreciated that the first release layer 707 can be formed such that it has an absorption coefficient within a range between any of the minimum and maximum values noted above.

The first release layer 707 can be formed to have a particular average thickness. For example, the thickness of the first release layer 707 can be significantly smaller than the average thickness of the base layer 205. For example, the first release layer 707 can have an average thickness of not greater about 100 microns, such as not greater about 80 microns, not greater than about 50 microns, or even not greater than about 30 microns. In other embodiments, the first release layer 707 can be formed such as it has an average thickness of at least about 1 micron, such as at least about 2 microns, at least about 3 microns, at least about 5 microns, or even at least about 10 microns. It will be appreciated that the first release layer 707 can have an average thickness within the range between any of the minimum or maximum values noted above.

In accordance with embodiment, the first release layer 707 can have a particular dislocation density as measure in an upper surface of the layer. For example, the dislocation density at the upper surface of the first release layer 707 can be substantially the same as a dislocation density at the upper surface of the first semiconductor layer 205. For example, the first release layer 707 can have a dislocation density that is not greater than about $1\times10^8$ dislocation/cm$^2$, such as not greater than about $1\times10^7$ dislocation/cm$^2$, not greater than about $6\times10^6$ dislocation/cm$^2$, or even not greater than about $1\times10^6$ dislocation/cm$^2$. In other embodiments, the first release layer 707 can have a dislocation density that is at least about $1\times10^3$ dislocation/cm$^2$, or even at least $2\times10^5$ dislocation/cm$^2$. It will be appreciated the first release layer 707 can have a dislocation density within a range between any of the minimum and maximum values noted above.

The first release layer 707, depending upon the growth process, may be grown at substantially the same rate as the first semiconductor layer 205. Notably, it may be preferable that the growth rate is not changed in transitioning from the formation of the first semiconductor layer 205 to formation of the first release layer 707. For example, the first release layer 707 can be formed at a growth rate of at least 50 microns per hour. In other embodiments, the rate of forming the first release layer 707 can be greater, such as at least about 75 micron per hours, at least about 100 microns per hour, at least about 150 microns per hour, at least about 200 microns per hour, or even at least about 250 microns per hour. In another embodiment, the first release layer 707 can be formed at a growth rate of not greater than about 1 mm per hour, such as not greater than 750 microns per hour not great 500 microns per hour, or even not greater than about 300 microns per hour. It will be appreciated the process of forming the first release layer 707 can be constructed at a rate within a range within any of the minimum maximum values noted above.

After forming the first release layer 707, the process can continue by forming the second semiconductor layer 709 over the first release layer 707. Formation of the second semiconductor layer 709 can be conducted during a continuous growth process, particularly under substantially the same conditions used to form the first semiconductor layer 205. Moreover, the second semiconductor layer 709 can have any of the same features of any semiconductor layer (e.g., the first semiconductor layer 205) of the embodiments herein.

After forming the second semiconductor layer 709, the process can continue by forming the second release layer 711 over the second semiconductor layer 709. Formation of the second release layer 711 can be conducted during a continuous growth process, particularly under substantially the same conditions used to form the first release layer 707. Moreover, the second release layer 711 can have any of the same features of any release layer (e.g., the first second release layer 707) of the embodiments herein.

After forming the second release layer 711, the process can continue by forming the third semiconductor layer 713 over the second release layer 711. Formation of the third semiconductor layer 713 can be conducted during a continuous growth process, particularly under substantially the same conditions used to form the first semiconductor layer 205. Moreover, the third semiconductor layer 713 can have any of the same features of any semiconductor layer (e.g., the first semiconductor layer 205) of the embodiments herein.

Referring to the first and second release layers 707 and 711, the second dopant material present within the second release layer 711 can be the same element or composition as the first dopant material present within the first release layer 707. Alternatively, in certain instances, the second dopant material can be different than the first dopant material, such that the first release layer 707 and the second release layer 711 can have different compositions. For example, the first dopant material can include a first element and the second dopant material can include a second element different than the first element of the first dopant material.

Moreover, the first release layer 707 and the second release layer 711 can have different concentrations of dopant material with respect to each other, which may facilitate different absorption characteristics between the first and second release layers 707 and 711 for radiation of a particular wavelength. For example, the first release layer 707 can have a first dopant concentration and the second release layer 711 can have a second dopant concentration, wherein the first dopant concentration is different than the second dopant concentration.

Furthermore, the first release layer 707 and the second release layer 711 can have different thicknesses with regard to each other, which may facilitate different absorption characteristics between the first and second release layers 707 and 711 for radiation of a particular wavelength. For example, in one instance the first release layer 707 can have a thickness that is greater than a thickness of the second release layer 711. Alternatively, the first release layer 707 can have a thickness that is less than a thickness of the second release layer 711.

The first and second release layers 707 and 711 can have different absorption coefficients compared to each other for radiation of a particular wavelength. For example, the first release layer 707 can have an absorption coefficient that makes it absorb greater than 50% of a first wavelength of radiation, while the second release layer 711 can have an absorption coefficient that makes it transmit substantially all of the radiation of the first wavelength. Alternatively, or additionally, the second release layer 711 can have an absorption coefficient that makes it absorb greater than 50% of a second wavelength of radiation, while the first release layer 707 can have an absorption coefficient that makes it transmit substantially all of the radiation of the second wavelength.

The selective absorption characteristics of the first and second release layers 707 and 711 facilitates selective separation of the semiconductive layers 725 from the boule 700 based on a selected wavelength of radiation. For example, selecting and impinging a first wavelength of radiation on the first release layer 707 can facilitate separation of the first semiconductor layer 705 from the second semiconductor layer 709 and/or other semiconductive layers 725 (i.e., the second release layer 711 and third semiconductor layer 713). Selecting and impinging a second wavelength of radiation on the second release layer 711 can facilitate separation of the third semiconductor layer 713 from the second semiconductor layer 709 and/or other semiconductive layers 725 (e.g., the first semiconductor layer 705 and the first release layer 707).

Selective absorption characteristics of the semiconductive layers 725 can also facilitate the production of multiple substrates which are ready for device formation. That is, the second and third semiconductor layers 711 and 713 of the boule 700 can be selectively separated and provided to a manufacturer of electronic devices as device-ready substrates. It will be appreciated that while only two release layers are illustrated, more release layers can be formed in a semiconductive substrate in an efficient manner using the continuous growth method disclosed herein.

It will also be appreciated that the formation of semiconductive substrates according to embodiments herein may be achieved without necessarily the creation of an intrinsic mask, modifying the surface of the substrate via grooving or roughening, or utilization of etching techniques.

It will also be appreciated that the formation of at least two discrete freestanding wafers from a semiconductor boule according to embodiments of the present disclosure can also be achieved with other procedures as well. In such embodiments, hillocks and/or protrusions are removed from the upper surface 210 of the semiconductor layer 205. The boule 700 would then be cut into freestanding wafers using, for example, a diamond saw. In such embodiments, each freestanding wafer would then be finished by employing at least one and up to all of grinding, lapping, polishing and/or CMP (chemical-mechanical planarization) processes.

EXAMPLE 1

A base substrate is formed by first growth of a two part buffer layer via MOVPE on a sapphire substrate. The buffer layer includes a first layer of silicon directly on the sapphire substrate, followed by epitaxial growth of AlN. After loading the sapphire substrate in the MOVPE reactor, the sapphire substrate has to be annealed under $N_2$ before growth of the silicon film. Preferably the temperature is 870° C. Silicon growth is formed from pyrolysis of silane in the $N_2$ atmosphere at 100 torr to a thickness of about 0.4 microns.

The temperature is raised to about 1140° C., the growth vapor still being pure $N_2$ at 70 torr. $NH_3$ is first introduced into the reaction chamber, and thereafter, a TMAl organometallic material is introduced to begin forming the AlN layer on the silicon. After approximately 20 minutes of growth, a 0.2 µm thick AlN layer is deposited on top of the Si layer, forming the buffer layer.

Manufacturing of the base layer is initiated by growth of GaN on the AlN layer via HVPE. Generally, the GaN bulk layer is grown to a thickness of at least 1.5 mm in 3D growth mode. The growth conditions for the bulk layer include a growth rate approximately 150 µm/h, a growth temperature of 950° C., a V/III ratio of 10, and a pressure of 200 torr.

After cooling, the GaN blank, which no longer attached to the sapphire substrate, is finished through grinding, lapping, polishing and CMP. For this example the N-polar surface is epi-ready finished through suitable CMP slurries such as colloidal silica. The finished GaN is used as a base GaN substrate for subsequent epitaxial growth of a GaN bulk layer.

The base GaN substrate is then introduced in the HVPE equipment with the N-polar face up. The GaN growth is carried out using a two step temperature process: 950° C. during 5 h and 1030° C. during 5 h. The GaN bulk layer is grown to a thickness of 0.4 mm; growth rate is thus approximately 40 µm/h. Growth conditions for the bulk layer include a V/III ratio of 13 and a pressure of 200 torr.

Growth of the GaN bulk layer having an N-face orientation exhibits a morphology based on generally hexagonal pyramids protrusions surrounded by valleys. The total size of the pyramid ranges from 100-200 µm, the tip of the pyramid ranging from 5-20 µm, and the height difference between the pyramid tip and base can be up to 50 µm. In a GaN bulk layer, the valley to peak (VP) ratio (the effective GaN crystal portion that can be used) is 85% in this epilayer in the case of a growth along the N-polarity, compared to 40-50% in the case of a growth along the Ga-polarity. The height ratio was less than about 0.25.

EXAMPLE 2

The base GaN substrate made according to Example 1 is then used in a single temperature process for growing a GaN bulk layer in HVPE equipment. The substrate is placed in the HVPE equipment with the N-polar face up. The GaN growth is carried out at a temperature of 950° C. for about 10 hours. The GaN bulk layer is grown to a thickness of 0.4 mm and the growth rate is approximately 40 µm/h. Growth conditions for the bulk layer include a V/III ratio of 13 and a pressure of 200 torr. The GaN bulk layer grown at the temperature of 950° C. throughout the process exhibits larger hexagonal pyramid protrusions on the N-face with the height ratio greater than approximately 0.3.

In the foregoing, reference to specific embodiments and the connections of certain components is illustrative. It will be appreciated that reference to components as being coupled or connected is intended to disclose either direct connection between said components or indirect connection through one or more intervening components as will be appreciated to carry out the methods as discussed herein. As such, the above-disclosed subject matter is to be considered illustrative, and not restrictive, and the appended claims are intended to cover all such modifications, enhancements, and other embodiments, which fall within the true scope of the present invention. Thus, to the maximum extent allowed by law, the scope of the present invention is to be determined by the broadest permissible interpretation of the following claims and their equivalents, and shall not be restricted or limited by the foregoing detailed description.

The Abstract of the Disclosure is provided to comply with Patent Law and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all features of any of the disclosed embodiments. Thus, the following claims are incorporated into the Detailed Description, with each claim standing on its own as defining separately claimed subject matter.

What is claimed is:

1. A method of forming a semiconductor substrate comprising:
    providing a base substrate comprising a semiconductor material; and
    forming a first semiconductor layer overlying the base substrate comprising a Group 13-15 material via hydride vapor phase epitaxy (HVPE), wherein the first semiconductor layer comprises an upper surface having a N-face orientation and comprising a plurality of protrusions, wherein the protrusions have a height ratio ($h/t_i$) of not greater than about 0.2, wherein h represents an average height of the plurality of protrusions and $t_i$ represents an average thickness of the first semiconductor layer.

2. The method of claim 1, wherein the base substrate comprises gallium nitride (GaN).

3. The method of claim 1, wherein forming the first semiconductor layer is conducted at a temperature greater than 950° C.

4. The method of claim 1, wherein the first semiconductor layer is formed directly on the base substrate without formation of an intervening buffer layer.

5. The method of claim 1, wherein the first semiconductor layer comprises gallium nitride (GaN).

6. The method of claim 1, wherein the first semiconductor layer comprises a dopant including Si, Ge, Fe, Mg, Zn, or combinations thereof.

7. The method of claim 1, wherein the average thickness of the first semiconductor layer is at least about 0.1 mm.

8. The method of claim 1, wherein forming the first semiconductor layer is conducted at a rate of at least about 50 microns/hr.

9. The method of claim 1, wherein forming the first semiconductor layer comprises a three-dimensional growth mode, a two-dimensional growth mode, and switching between a three-dimensional and two-dimensional growth mode during epitaxial growth.

10. The method of claim 1, wherein each protrusion of the plurality of protrusions defines a permanent defect region, wherein the permanent defect region comprises a shift in the regular arrangement of crystalline planes, wherein the permanent defect region comprises at least one of an inclusion, a polycrystalline grain, a single crystalline grain, an inversion domain, a permanent defect, and a combination thereof.

11. The method of claim 1, further comprising removing at least a portion of the upper surface of the first semiconductor layer, wherein removing includes removing a plurality of protrusions from the upper surface, wherein removing comprises reducing a thickness of the first semiconductor layer by not greater than about 15% of an original average thickness of the first semiconductor layer.

12. The method of claim 1, further comprising removing a portion of a back surface of the first semiconductor layer opposite the upper surface, wherein the back surface has a Ga-face orientation, wherein removing comprises a mechanical process, wherein removing including grinding, wherein removing comprises polishing.

13. The method of claim 1, wherein forming the first semiconductor layer is conducted to form a boule, wherein the boule comprises a semiconductor layer having an average thickness sufficient to form at least two discrete freestanding semiconductor wafers from the first semiconductor layer.

14. The method of claim 13, wherein the boule further comprises a release layer.

15. The method of claim 1, wherein the first semiconductor layer is a boule comprising an average thickness of at least 1 cm.

16. A method of forming a series of semiconductor substrates using a single forming process, the method comprising:
    providing a base substrate comprising a semiconductor material comprising nitrogen, wherein the base substrate comprises a growth surface having a N-face orientation;
    forming a boule overlying the base substrate, wherein the boule comprises:
        a first semiconductor layer overlying the base substrate;
        a first release layer overlying the first semiconductor layer;
        a second semiconductor layer overlying the first release layer;
        a second release layer overlying the second semiconductor layer; and
    separating the first and second semiconductor layers to form a plurality of discrete semiconductor substrates, wherein the first release layer has a first absorption coefficient such that the first release layer absorbs greater than 50% of a first wavelength of radiation, and the second release layer has a second absorption coefficient such that the second release layer transmit substantially all of the radiation of the first wavelength.

17. The method of claim 16, wherein the first semiconductor layer is formed directly on the growth surface of the base substrate, wherein the first semiconductor layer is formed directly on the growth surface of the base substrate without formation of an intervening buffer layer.

18. The method of claim 16, wherein separating comprises impinging the first wavelength of radiation on the first release layer to separate the first semiconductor layer from the second semiconductor layer.

19. The method of claim 16, wherein the first release layer comprises a first dopant material and the second release layer comprises a second dopant material that is different from the first dopant material.

20. The method of claim 16, wherein the first semiconductor layer comprises GaN, and the second semiconductor layer comprises GaN.

\* \* \* \* \*